United States Patent
Singhal et al.

(10) Patent No.: US 9,755,649 B1
(45) Date of Patent: Sep. 5, 2017

(54) PROTECTION AGAINST TAMPER USING IN-RUSH CURRENT

(71) Applicant: Xilinx, Inc., San Jose, CA (US)

(72) Inventors: Richa Singhal, San Jose, CA (US); Edmond Jordan, San Jose, CA (US); Ahmad R. Ansari, San Jose, CA (US)

(73) Assignee: XILINX, INC., San Jose, CA (US)

( * ) Notice: Subject to any disclaimer, the term of this patent is extended or adjusted under 35 U.S.C. 154(b) by 40 days.

(21) Appl. No.: 14/617,424

(22) Filed: Feb. 9, 2015

(51) Int. Cl.
*H03K 19/177* (2006.01)

(52) U.S. Cl.
CPC .................. *H03K 19/17768* (2013.01)

(58) Field of Classification Search
None
See application file for complete search history.

(56) References Cited

U.S. PATENT DOCUMENTS

| | | | |
|---|---|---|---|
| 6,782,479 B1* | 8/2004 | Williams | G06F 21/75 380/52 |
| 2006/0117393 A1* | 6/2006 | Merry, Jr. | G06F 12/1433 726/34 |
| 2011/0185110 A1* | 7/2011 | Smigelski | G06F 21/79 711/103 |
| 2012/0070002 A1* | 3/2012 | Smith | H04L 9/085 380/277 |

\* cited by examiner

*Primary Examiner* — Jany Richardson
(74) *Attorney, Agent, or Firm* — Frederick Hsu; Gerald Chan (57) ABSTRACT

A method for protecting an integrated circuit device against security violations includes monitoring a component of the integrated circuit device for security violations. A security violation of the component of the integrated circuit device is then identified. The component of the integrated circuit device is then internally destroyed in response to the identified security violation by providing current to the component beyond a tolerable limit of the component.

19 Claims, 5 Drawing Sheets

PROTECTION AGAINST TAMPER USING IN-RUSH CURRENT

FIELD OF THE INVENTION

The disclosure generally relates to integrated circuits, and in particular to a mechanism for protection of integrated circuit components against tamper using in-rush current.

BACKGROUND

Integrated circuits (ICs) can be implemented to perform specified functions. One type of IC is a programmable IC such as, e.g., a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable, including, for example, application specific integrated circuits (ASICs). For instance, another type of programmable IC includes a combination of hard-coded transistor logic and a programmable switch fabric that programmably interconnects the hard-coded transistor logic.

Some modern ICs, including some of the varieties of ICs discussed above, include an embedded processor that is capable of executing program code. The processor can be fabricated as part of the same die that includes the programmable logic circuitry and the programmable interconnect circuitry, also referred to collectively as "programmable circuitry" of the IC. It should be appreciated that the execution of program code within a processor is distinguishable from "programming" or "configuring" the programmable circuitry that may be available on an IC. The act of programming or configuring programmable circuitry of an IC using configuration data results in the implementation of different physical circuits within the programmable circuitry.

Certain applications of such integrated circuits and devices involve storing or propagating highly sensitive or confidential information between components of the integrated circuits. With such applications, it is imperative that external entities are unable to gain access to or modify such information.

SUMMARY

A method is provided for protecting an integrated circuit device against security violations. The method includes monitoring a component of the integrated circuit device for security violations, identifying a security violation of the component of the integrated circuit device, and internally destroying the component of the integrated circuit device in response to the identified security violation by providing an amount of current to the component beyond a tolerable limit of the component.

An integrated circuit device is provided. The integrated circuit device includes a processor system (PS) domain, a programmable logic (PL) domain, and a power management module configured to internally destroy one or more components of the integrated circuit device in response to an identified security violation of the integrated circuit device by providing an amount of current to the one or more components beyond tolerable limits of the one or more components.

Other features will be described in the detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

DETAILED DESCRIPTION OF THE DRAWINGS

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Embodiments described herein provide a method for protecting an integrated circuit device against security violations (e.g., tampering, unauthorized attempts at accessing information within the IC, etc.). For example, a component of the integrated circuit device is internally monitored for security violations, and the component is destroyed internally in response to an identified security violation. The component is destroyed internally by providing current to the component beyond tolerable limits. Because destruction of the component is handled internally, it may be completed in a more time-efficient manner than having to rely on an external source for completing the destruction. Moreover, because destruction is handled internally, there is a smaller likelihood that it may be prevented.

Figure 1:
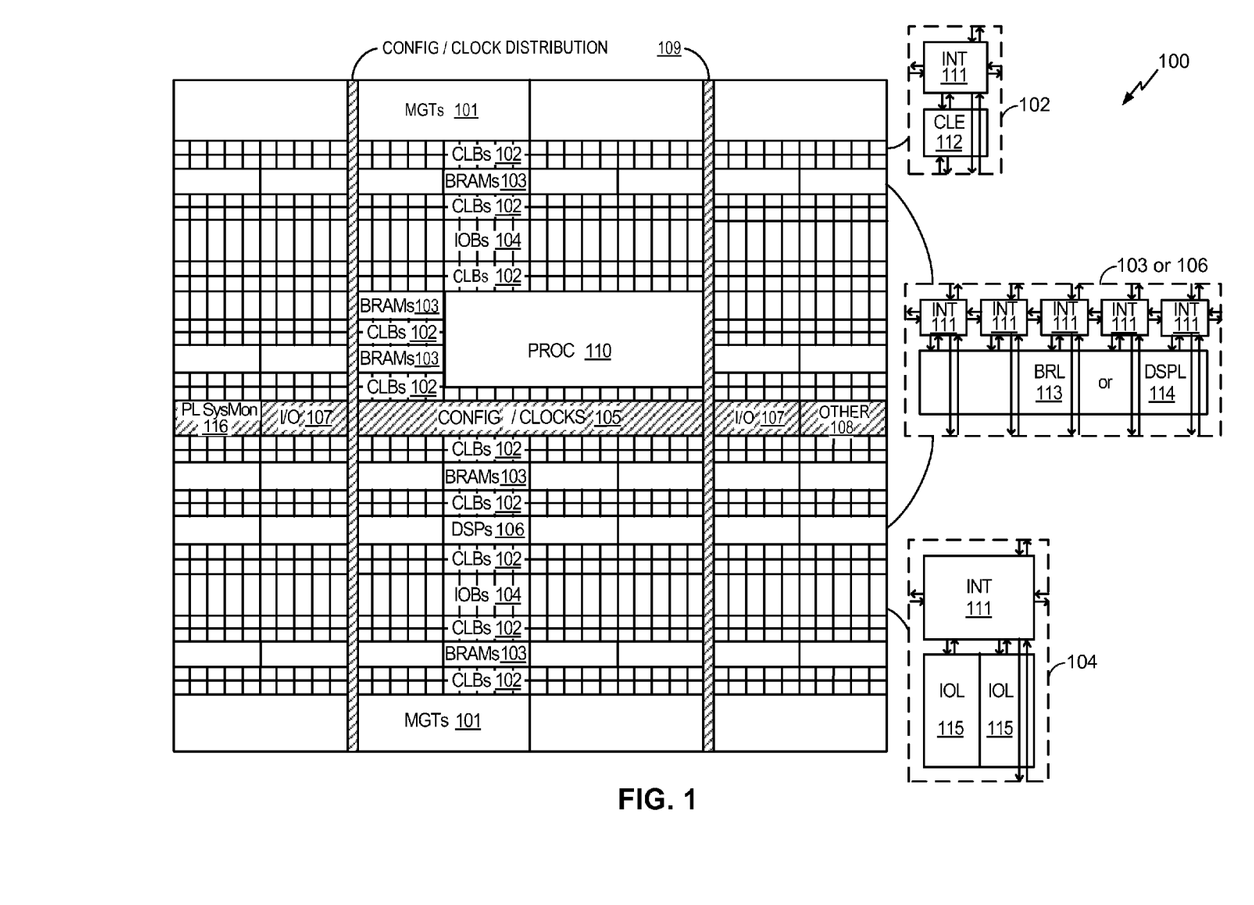
FIG. 1 is a block diagram illustrating an architecture for an IC.

FIG. 1 is a first block diagram illustrating an architecture 100 for an IC. Architecture 100 can be implemented within a field programmable gate array (FPGA) type of IC, for example. As shown, architecture 100 includes several different types of programmable circuit, e.g., logic blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the picture embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107 and 108, can be used for configuration, clock and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

PROC 110 can be implemented as a hard-wired processor that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like. It should be appreciated, however, that the inclusion of a hard-wired processor such as PROC 110 can be excluded from architecture 100 and replaced with one or more of the other varieties of programmable blocks described. Further, such blocks can be utilized to form a "soft processor" in that the various blocks of programmable circuitry can be used to form a processor that can execute program code as is the case with hard-wired PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream". In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation of the one or more embodiments disclosed within this specification.

Figure 2:
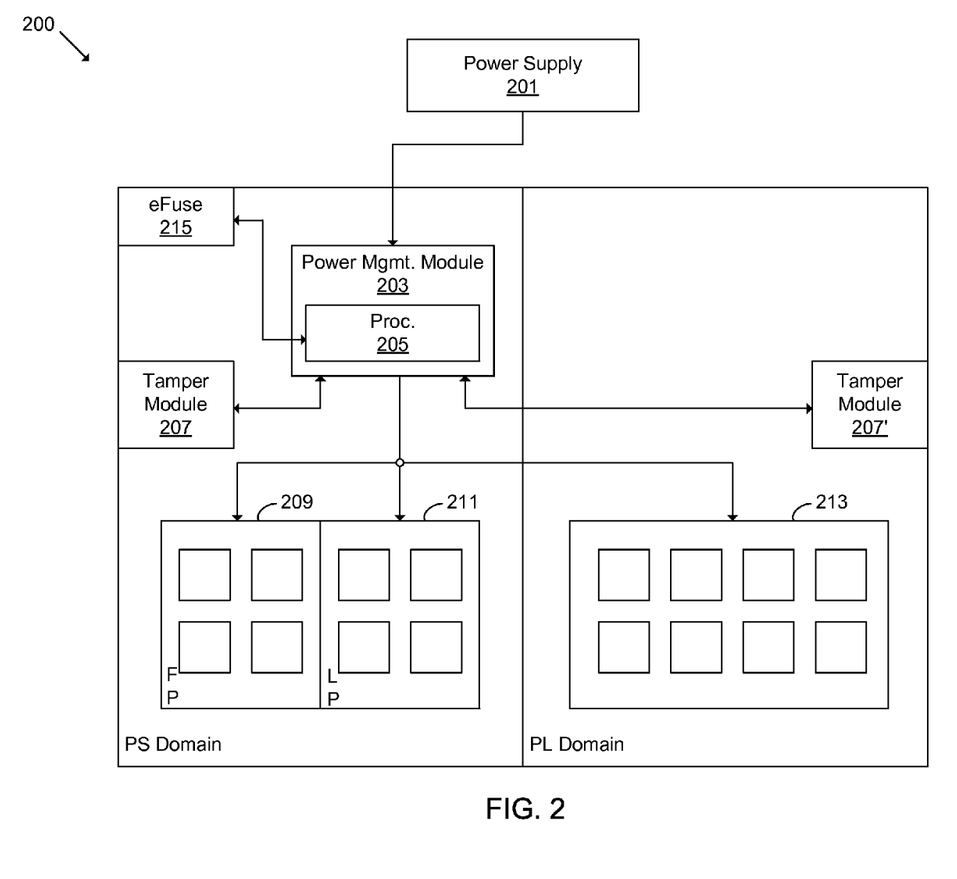
FIG. 2 is a block diagram illustrating an IC configured to protect against security violations by providing in-rush current according to some embodiments.

FIG. 2 is another block diagram illustrating another IC 200 configured in accordance with another embodiment. IC 200 can be implemented using any of a variety of different architectures that include a processor system (PS) domain coupled to programmable logic (PL) domain. For example, IC 200 can be implemented using an architecture that is the same as, or similar to, that of architecture 100 of FIG. 1, though this need not be the case. In general, IC 200 illustrates various components of the PS and PL domains and a number of interactions that may occur between those components.

The IC 200 may be powered via an external power supply 201, such as a power source located in a package substrate (e.g., PCB) associated with the IC 200 or a power source external to the package housing the IC 200. A power management module 203 may be located within the PS Domain and configured to manage power distribution to various components of the IC 200, including both components located in the PS domain as well as components located in the PL domain, which will be described in greater detail below. The power management module 203 may include an embedded processor 205 configured to aid in carrying out power management functionality for the IC 200.

Both the PS domain and the PL domain may include various components. As depicted in FIG. 2, the PS domain includes a first set of components 209 and a second set of components 211 and the PL domain includes a set of components 213. The first set of components 209 and the second set of components 211 in the PS domain may include various components, such as for example, memory components, memory controllers and I/O modules and the set of components 213 in the PL domain may also include various components such as the programmable circuits and interconnects described above with respect to FIG. 1.

In some embodiments, components of the PS domain and/or PL domain may reside in different power domains. For example, the first set of components 209 of the PS domain may require a larger power supply and may therefore reside in a full power (FP) domain while the second set of components 211 of the PS domain may require a smaller power supply and therefore may reside in a low power (LP) domain as illustrated in FIG. 2.

The PS domain may additionally include one or more eFuses 215. eFuses 215 refer to computer logic that is "etched" or "hard-coded" into the device such that it cannot be changed after the IC has been manufactured. The eFuses 215 may include important information that is crucial for facilitating the operation of the IC.

Both the PS domain and the PL domain may include tamper modules 207, 207', for identifying security violations of the IC 200. Tamper modules 207, 207' may be configured to detect changes in characteristics of the IC (e.g., voltage, temperature) that are indicative of tampering. For example, a change in temperature of the IC beyond a tolerable threshold may indicate an attempted security breach of the device. As another example, a change in operating frequency or an identification of an unexpected mismatched security key may also be indicative of an attempted security breach of the device. The tamper modules 207, 207' may each be configured to monitor an entire domain of the IC or one or more individual components within a domain of the IC.

The power management module 203 is configured to manage the distribution of power to the components 209, 211, 213 of the PS domain and PL domain during operation of the IC. In order to ensure proper functioning of the IC 200, the power management module 203 may exercise power sequencing. Power sequencing refers to the action of collectively or individually providing power up and power down to different components 209, 211, 213 of the IC device, such that the components 209, 211, 213 are never in a state where an intolerable amount of current/power is flowing through them.

As mentioned above, certain applications of such integrated circuits 200 involve storing or propagating highly sensitive or confidential information between components of the integrated circuits. With such applications, it is imperative that external entities are unable to gain access to or modify such information. As used herein, the term "security violation" describes any attempt to access sensitive or confidential information in a component of the integrated circuit device or any unauthorized attempt to modify settings of the integrated circuit device.

In order to protect against such security violations, the tamper modules 207, 207' and power management module 203 will work in conjunction to monitor the integrated circuit device for security violations and destroy components of the integrated circuit device in response to identifying any security violations, which will be described in greater detail below.

During operation of the integrated circuit, each tamper module 207, 207' will monitor certain characteristics for identifying security violations. For example, the tamper modules 207, 207' may be configured to monitor voltage and temperature changes of IC components in their respective domains. Additionally or alternatively, the tamper modules 207, 207' may be configured to monitor frequency changes or security key-code changes of different portions of the integrated device. When a change occurs that is indicative of a security violation, the tamper modules 207 will alert the processor 205 of the power management module 203. Although the power management module 203 is intended to provide current/power to the components of the integrated circuit in a limiting manner to prevent the components from being damaged, such functionality may be overridden in the event of a security violation, and the power management module 203 may be made to provide intolerable amounts of current into components of the integrated circuit device for destruction.

In response to the identified security violation, the power management module 203 will internally destroy one or more components of the integrated circuit device by providing an amount of current into the one or more components beyond tolerable limits of the one or more components. The amount of current needed to destroy a component may vary from component to component. As an example, let's assume that a component can tolerate a maximum current of 4 A. Providing power from the power supply in excess of 4 A will cause the component to heat up at a faster rate than the component is able to dissipate heat, thereby causing the component to be damaged.

In certain situations, the power management module 203 may destroy the component(s) most closely associated with the identified security violation. For example, where a tamper module 207, 207' identifies a security violation occurring at a particular integrated circuit component, the power management module 203 may respond by destroying the integrated circuit component(s) most closely associated with the identified security violation. The power management module 203 may provide current into components in the integrated circuit in a manner such that only the identified component is destroyed and components of the integrated circuit that are not directly associated with the security violation are unaffected and may continue to operate normally.

In other situations, the power management module 203 may destroy all components located in the domain at which the security violation occurred. For example, where a tamper module 207 identifies a security violation occurring at an integrated circuit component of the PS domain, the power management module 203 may respond by destroying all components in the PS domain. The power management module 203 may provide current into components of the integrated circuit in a manner such that only components in the PS domain are destroyed and components of the integrated circuits in the PL domain are unaffected and may continue to operate normally.

In other situations, the power management module 203 may destroy all components located in the integrated circuit when a security violation occurs. For example, where a tamper module 207. 207' identifies a security violation occurring, the power management module 203 may respond by destroying all components in the PS domain and the PL domain. The power management module 203 may provide current into components of the integrated circuit in a manner such that no components in the integrated circuit are able to continue operating normally.

In some situations, the power management module 203 may be able to discern between security violations directed at accessing sensitive information versus security violations directed at accessing non-sensitive information. Here, the power management module 203 may determine that a security violation directed at non-sensitive information does not warrant destruction of IC components, and as such may take other corrective action such as powering down or restarting the IC component rather than providing an intolerable amount of in-rush current into the IC component. However, where the power management module 203 determines that a security violation is directed at accessing sensitive information, it may act accordingly and destroy one or more affected IC components.

In addition to destroying components of the integrated circuit in response to identifying a security violation, eFuses of the integrated circuit device may also be optionally burned. Because the eFuses may contain logic that is necessary for the proper operation of the IC, the eFuses may be burned only after all of the necessary components of the IC device are destroyed in response to a security violation. By burning one or more eFuses, certain IC features associated with those eFuses may be enabled or disabled.

By internally destroying a component(s) of the integrated circuit device in response to a security violation, destruction may be completed in a more time-efficient manner than having to rely on an external source for completing the destruction. Moreover, because destruction is handled internally, there is a smaller likelihood that it may be prevented.

Figure 3:
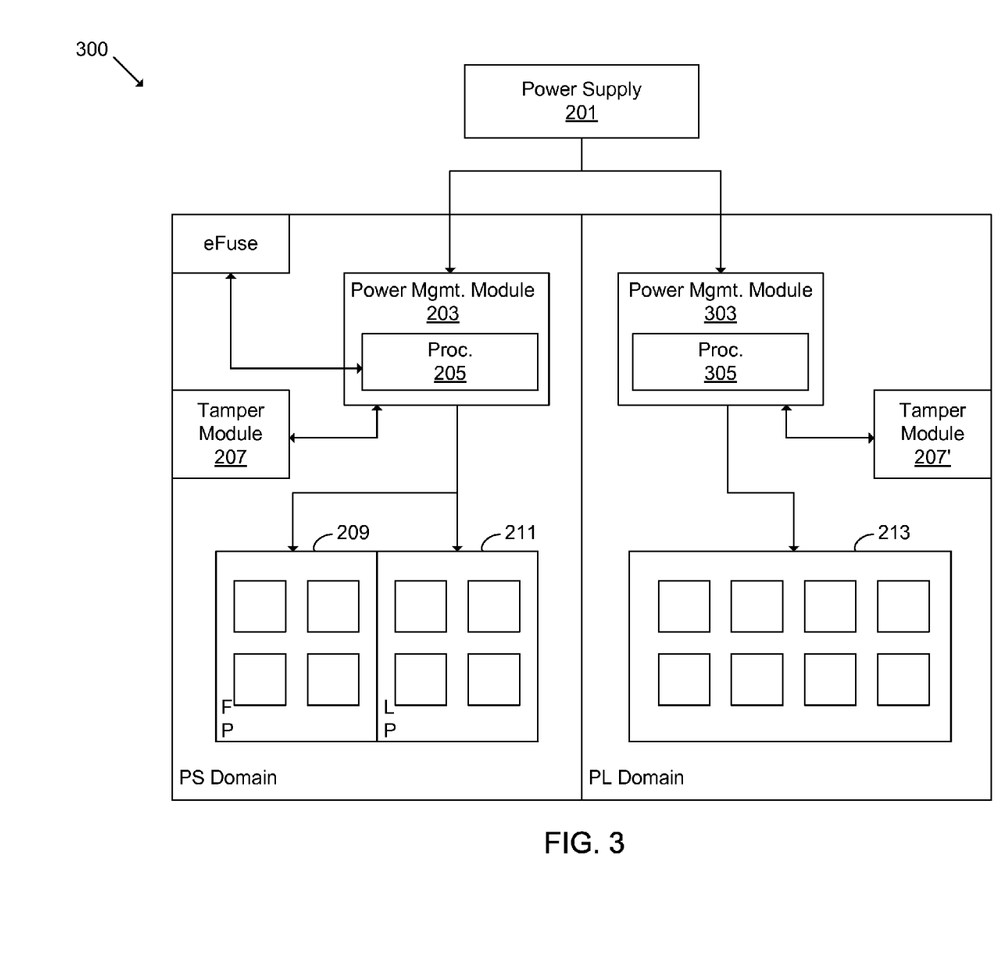
FIG. 3 illustrates an alternative IC configured to protect against security violations by providing in-rush current according to some embodiments.

FIG. 3 illustrates an alternative IC 300 configured to protect against security violations by providing in-rush current into components of the IC device. For purposes of simplicity, only elements of FIG. 3 that were not previously described with reference to FIG. 2 will be described in detail. The integrated circuit 300 illustrated in FIG. 3 is similar to the integrated circuit 200 illustrated in FIG. 2, except that an additional power management module 303 and processor 305 are included in the PL domain. Thus, rather than having a single power management module 203 and processor providing power management functionality to the entire IC, a separate power management module 203, 303 will be provided to each domain (i.e., PS domain and PL domain) for independently providing power management functionality to IC components residing in its corresponding domain.

FIGS. 2 and 3 illustrate only a few example embodiments of integrated circuits having the capability of protecting against security violations by providing in-rush current beyond tolerable limits. However, one ordinarily skilled in the art will recognize that any number of integrated circuit device architectures may be provided with the capability of protecting against security violations by providing in-rush current beyond tolerable limits.

Figure 4:
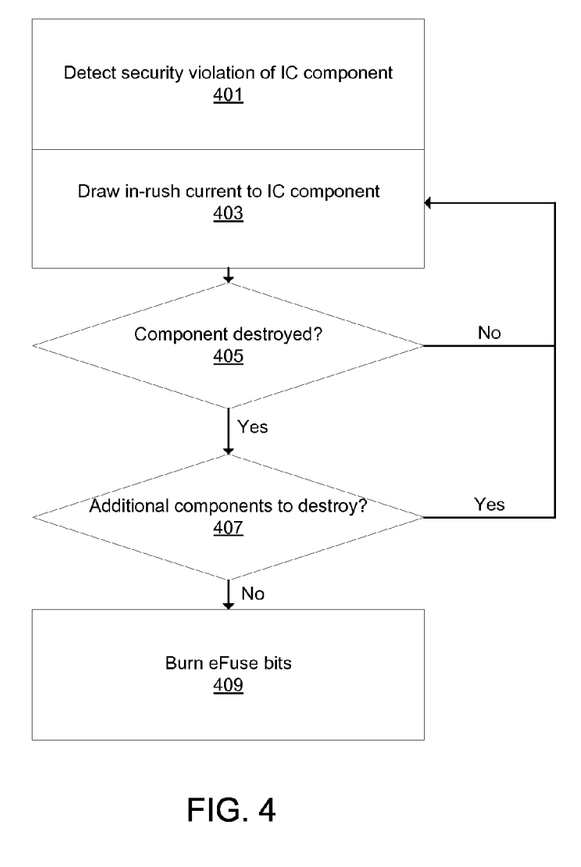
FIG. 4 is a flow diagram illustrating a method for protecting an integrated circuit device against security violations by providing in-rush current according to some embodiments.

FIG. 4 is a flow diagram illustrating a method for protecting an integrated circuit device against security violations. The method described below may be utilized for any integrated circuit having a power management module that provides power management functionality to components of an integrated circuit, and need not only be utilized in the context of the example integrated circuits described in FIGS. 2 and 3.

Initially a security violation of a component of the integrated circuit is detected as shown at 401. In some examples, a tamper module residing within the integrated circuit may be configured to monitor components of the IC for any characteristic changes that may be indicative of a security violation. For example, voltage characteristics or temperature characteristics of the components may be monitored and unexpected voltage or temperature variations may be identified by the tamper module and presented as an alert to the power management module. The unexpected voltage or temperature variations may be compared against a threshold voltage or temperature and values falling outside the threshold may result in a security violation being identified. Alternatively or additionally, frequency characteristics or security key-code changes of the integrated circuit device may also be monitored and identified by the tamper module and presented as an alert to the power management module.

In some embodiments, integrated circuit may include both a PS domain and a PL domain, and each domain may be equipped with a tamper module for monitoring/detecting security violations that occur in its corresponding set of components.

Once a security violation has been identified, the power management module may provide in-rush current to the component as shown at 403. The amount of in-rush current provided by the power management module may be beyond the tolerable limits of the component to be destroyed.

Although providing enough in-rush current to completely render the component non-operational in a single iteration may be desirable, there may be situations where multiple in-rush iterations are needed to complete the destruction of the component. Thus, after the power management module provides in-rush current into the identified component, a check is made to determine whether the component is completely destroyed as shown at 405. If the power management module determines that the component is not yet destroyed, then the method returns to 403 where in-rush current is again provided to the component and the process is repeated until the component is no longer operational. For example, the power management module may be equipped with the capability to ping the identified component. When the identified component is not yet destroyed, it responds to pings from the power management module. If, however, the identified component is destroyed, it is no longer capable of responding to pings from the power management module. Once a number of failed responses from the identified component has occurred, the power management module is able to verify that the identified component is properly destroyed.

After the component has been destroyed, the power management module determines whether any additional components in the integrated circuit device are to be destroyed as shown at 407. For example, where the security violation occurred in a particular domain (e.g., PS domain or PL domain) of the integrated circuit, all components of the domain or any components within the domain closely associated with the security violation may be destroyed. As another example, the security violation may impact the entire integrated circuit, and as such all components of the integrated circuit may be destroyed in response to the security violation.

If the power management module determines that an additional component of the IC is to be destroyed, then the method returns to 403, where in-rush current is provided into the additional component beyond tolerable limits and a determination is made at 405 as to whether the additional component has been destroyed. This process is repeated until all additional components in the IC are destroyed by providing in-rush current.

Although the destruction of components of the integrated circuit has been described as occurring in a piece-meal fashion, it is important to note that the described mechanism for destroying components of the integrated circuit may be extended to encompass the simultaneous destruction of multiple components of the integrated circuit.

After the appropriate components of the integrated circuit device have been destroyed by providing in-rush current, eFuses of the integrated circuit device may also optionally be burned as shown at 409. Because the eFuses may contain logic that is necessary for the proper operation of the IC, the eFuses may be burned only after all of the necessary components of the IC device are destroyed in response to a security violation.

In some examples, providing in-rush current into an IC component results in permanent destruction of the component. Because of the irreversible nature of destroying an IC component, there may be situations where a security violation of an IC component does not necessarily warrant its permanent destruction. As such, the power management module or another component of the IC may be equipped with the ability to differentiate between different types of security violations. For example, the power management module or other IC component may be able to distinguish between security violations which access sensitive information and security violations that do not affect the protection of sensitive information. The power management module may then decide whether or not to provide in-rush current into an IC component based on vulnerability of sensitive information resulting from the security violation. Where the security violation does not affect the security of sensitive information, the power management module may simply take no action or alternatively perform a more temporary protective measure such as shutting down or restarting the IC component.

Figure 5:
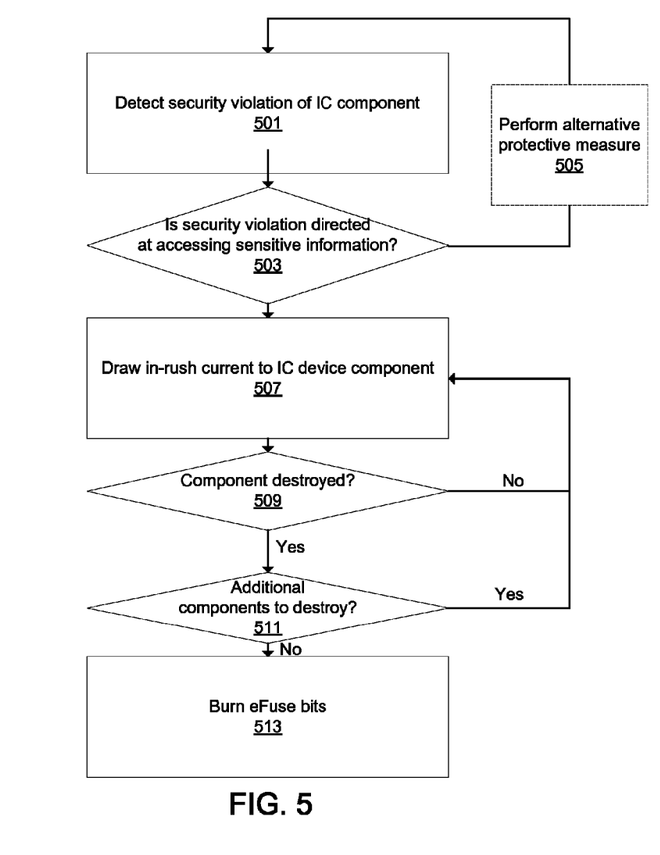
FIG. 5 is a flow diagram illustrating an alternative method for protecting an integrated circuit device against security violations that accounts for different types of security violations according to some embodiments.

FIG. 5 is a flow diagram illustrating an alternative method for protecting an integrated circuit device against security violations that accounts for different types of security violations. As mentioned above, situations may arise whereby a security violation may occur that is not directed at accessing sensitive information stored or propagating within the IC. In such circumstances, it may not be the best course of action to respond by irreversibly destroying IC components. This is because destruction of the IC component is a permanent action that cannot be reversed and leaves the IC component inoperable for the remainder of the IC's life.

Thus, rather than simply destroying an IC component in response to a security violation, a power management module or tamper module may be equipped with the intelligence to discern between different types of security violations and take action in line with the security violation type.

Initially a security violation of a component of the integrated circuit is detected as shown at 501. In some examples, a tamper module residing within the integrated circuit may be configured to monitor components of the IC for any characteristic changes that may be indicative of a security violation. For example, voltage characteristics or temperature characteristics of the components may be monitored and unexpected voltage or temperature variations may be identified by the tamper module and presented as an alert to the power management module. The unexpected voltage or temperature variations may be compared against a threshold voltage or temperature and a measurement falling outside the threshold may result in a security violation being identified. Alternatively or additionally, frequency characteristics or security key-code changes of the integrated circuit device may also be monitored and identified by the tamper module and presented as an alert to the power management module. The threshold values may be stored locally at the tamper module or may alternatively be stored at some other memory location on or remote to the IC device.

Once the security violation has been detected, a determination as to whether the security violation is directed at accessing sensitive information may be made as shown at 503. In some examples, the tamper module may identify the particular IC component at which the security violation occurred as well as the type of information being stored or propagated by the IC component.

If it is determined that the security violation is directed at accessing non-sensitive information, then the power management module may decide to optionally perform an alternative protective measure such as powering down or restarting IC components that may have been affected as shown at 505. In other situations, the power management module may decide that the security violation presents very little threat to the IC and decide to perform no action at all in response to the identified security violation. The IC device then returns to 501, where it awaits detection of another security violation.

If instead, it is determined that the security violation is directed at accessing sensitive information, the power management module may provide in-rush current to the component as shown at 507. The amount of in-rush current provided by the power management module may be beyond the tolerable limits of the component to be destroyed.

Although providing enough in-rush current to completely render the component non-operational in a single iteration may be desirable, there may be situations where multiple in-rush iterations are needed to complete the destruction of the component. Thus, after the power management module provides in-rush current into the identified component, a check is made to determine whether the component is completely destroyed as shown at 509. If the power management module determines that the component is not yet destroyed, then in-rush current is again provided to the component and the process is repeated until the component is no longer operational.

After the component has been destroyed, the power management module determines whether any additional components in the integrated circuit device are to be destroyed as shown at 511. For example, where the security violation occurred in a particular domain (e.g., PS domain or PL domain) of the integrated circuit, all components of the domain or any components within the domain closely associated with the security violation may be destroyed. As another example, the security violation may impact the entire integrated circuit, and as such all components of the integrated circuit may be destroyed in response to the security violation.

If the power management module determines that an additional component of the IC is to be destroyed, then the method returns to 507, where in-rush current is provided to the additional component beyond tolerable limits and a determination is made at 509 as to whether the additional component has been destroyed. This process is repeated until all additional components in the IC are destroyed by providing in-rush current.

Although the destruction of components of the integrated circuit has been described as occurring in a piece-meal fashion, it is important to note that the described mechanism for destroying components of the integrated circuit may be extended to encompass the simultaneous destruction of multiple components of the integrated circuit.

After the appropriate components of the integrated circuit device have been destroyed by providing in-rush current, eFuses of the integrated circuit device may also be burned as shown at 513. Because the eFuses may contain logic that is necessary for the proper operation of the IC, the eFuses may be burned only after all of the necessary components of the IC device are destroyed in response to a security violation.

As already mentioned above, by internally destroying a component(s) of the integrated circuit device in response to a security violation, destruction may be completed in a more time-efficient manner than having to rely on an external source for completing the destruction. Moreover, because destruction is handled internally, there is a smaller likelihood that it may be prevented.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

What is claimed is:

1. A method for protecting an integrated circuit device against security violations, comprising:
    monitoring a characteristic of a component of the integrated circuit device for security violations;
    identifying a security violation of the component of the integrated circuit device, wherein the act of identifying the security violation comprises identifying an attempted security breach of the integrated circuit device, wherein the act of identifying the security violation of the component of the integrated circuit device comprises determining whether the characteristic of the component being monitored has a variation that is outside a threshold, and wherein the act of identifying the security violation comprises identifying a voltage change, identifying a frequency characteristic change, or identifying a security key-code change; and
    in response to the identified security violation, performing an act comprising (a) internally destroying the component of the integrated circuit device by providing current to the component beyond a tolerable limit of the component, (b) powering down the integrated circuit device, (c) restarting the component, or (d) taking no action.

2. The method of claim 1, wherein destroying the component of the integrated circuit device in response to the identified security violation comprises:
    providing a first amount of current to the component;
    verifying the destruction of the component; and
    providing one or more additional amounts of current to the component until the destruction of the component is verified.

3. The method of claim 1, further comprises:
    internally destroying one or more other components of the integrated circuit device in response to the identified security violation by providing current to the one or more other components beyond tolerable limits for the one or more components.

4. The method of claim 3, wherein internally destroying the component and the one or more other components of the integrated circuit device comprises destroying all of the components that are in the same domain of the integrated circuit device or that are associated with the security violation.

5. The method of claim 1, further comprises:
    burning an eFuse of the integrated circuit devices in response to the identified security violation, the eFuse having computer logic that is etched or hard-coded.

6. The method of claim 1, wherein the component is located within a processing system (PS) domain of the integrated circuit device, or within a programmable logic (PL) domain of the integrated circuit device.

7. The method of claim 1, further comprising determining that the security violation is directed at accessing sensitive information before internally destroying the component of the integrated circuit device.

8. The method of claim 1, further comprising identifying a type of the identified security violation from a plurality of different types of security violations, or identifying a level of treat of the identified security violation from a plurality of different levels of threat;

wherein the act is in line with the identified type of the identified security violation, or is in line with the identified level of threat.

9. The method of claim 1, wherein the component comprises a memory, and wherein the method further comprises destroying an additional component of the integrated circuit device in response to the identified security violation, wherein the additional component is different from the memory.

10. The method of claim 1, wherein the component being monitored is in a processing system (PS) domain, and wherein the method further comprises monitoring an additional component of the integrated circuit in a programmable logic (PL) domain for security violations.

11. An integrated circuit device, comprising:
   a processor system (PS) domain;
   a programmable logic (PL) domain; and
   a power management module configured to, in response to an identified security violation of the integrated circuit device, (a) internally destroy one or more components of the integrated circuit device by providing current to the one or more components beyond tolerable limits of the one or more components, (b) power down the integrated circuit device, (c) restart the one or more components, or (d) take no action, wherein the security violation comprises an attempted security breach of the integrated circuit device;
   wherein the identified security violation comprises an identified variation of a characteristic of the one or more components being monitored, the identified variation comprising voltage change, an identified frequency characteristic change, or an identified security key-code change.

12. The integrated circuit device of claim 11, wherein the power management module is located within the processor system (PS) domain or within the programmable logic (PL) domain.

13. The integrated circuit device of claim 11, further comprising a tamper module configured to identify security violations of the one or more components.

14. The integrated circuit device of claim 13, wherein the tamper module is located within the processor system (PS) domain and configured to identify security violations of components within the processor system (PS) domain, or is located within the programmable logic (PL) domain and configured to identify security violations of components within the programmable logic (PL) domain.

15. The integrated circuit device of claim 13, wherein the tamper module is located within the processor system (PS) domain and configured to identify security violations of components within the programmable logic (PL) domain and those of components within the processor system (PS) domain.

16. The integrated circuit device of claim 11, further comprising:
   one or more eFuses for dynamically reprogramming the integrated circuit device, the one or more eFuses having computer logic that is etched or hard-coded; and
   wherein the power management module is further configured to burn the one or more eFuses in response to the identified security violation.

17. The integrated circuit device of claim 11, wherein the power management module is configured to identify a type of the identified security violation from a plurality of different types of security violations, or to identify a level of threat of the identified security violation from a plurality of different levels of threat; and
   wherein the power management module is configured to perform one of the acts of (a)-(d) that is in line with the identified type of the identified security violation, or that is in line with the identified level of threat.

18. The integrated circuit device of claim 11, wherein the one or more components comprise a memory, and wherein the power management module is configured to destroy an additional component of the integrated circuit device in response to the identified security violation, wherein the additional component is different from the memory.

19. The integrated circuit device of claim 11, wherein the one or more components comprise a first component in the PS domain, and a second component in the PL domain.

* * * * *